(12) United States Patent
Wang et al.

(10) Patent No.: US 12,575,213 B2
(45) Date of Patent: Mar. 10, 2026

(54) FLOATING DIFFUSION REGION FORMED VIA SHARED PHOTOMASK AND METHODS THEREOF

(71) Applicant: OMNIVISION TECHNOLOGIES, INC., Santa Clara, CA (US)

(72) Inventors: Qin Wang, San Jose, CA (US); Yu Jin, Lawrence Township, NJ (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 539 days.

(21) Appl. No.: 18/079,201

(22) Filed: Dec. 12, 2022

(65) Prior Publication Data

US 2024/0194719 A1 Jun. 13, 2024

(51) Int. Cl.
*H10F 39/00* (2025.01)
*H10F 39/18* (2025.01)

(52) U.S. Cl.
CPC ......... *H10F 39/813* (2025.01); *H10F 39/014* (2025.01); *H10F 39/18* (2025.01); *H10F 39/802* (2025.01); *H10F 39/8037* (2025.01)

(58) Field of Classification Search
CPC ...... H10F 39/18; H10F 39/014; H10F 39/802; H10F 39/8037; H10F 39/813; H10F 39/80373; H10F 39/807
See application file for complete search history.

(56) References Cited

U.S. PATENT DOCUMENTS

| | | | |
|---|---|---|---|
| 7,115,923 B2 | 10/2006 | Hong | |
| 7,115,925 B2 | 10/2006 | Rhodes | |
| 7,385,232 B2 | 6/2008 | Patrick | |
| 7,755,119 B2 | 7/2010 | Rhodes | |
| 2018/0182794 A1* | 6/2018 | Go | H10F 39/8037 |
| 2018/0182804 A1* | 6/2018 | Lee | H04N 25/77 |
| 2018/0350856 A1* | 12/2018 | Masagaki | H01L 21/76 |
| 2019/0131328 A1* | 5/2019 | Kim | H10F 39/18 |
| 2019/0165018 A1* | 5/2019 | Park | H10F 39/813 |
| 2021/0202553 A1* | 7/2021 | Mun | H10F 39/807 |
| 2023/0067685 A1* | 3/2023 | Zang | H10F 39/80373 |

(Continued)

FOREIGN PATENT DOCUMENTS

| | | | | |
|---|---|---|---|---|
| KR | 20170109910 A | * | 10/2017 | ....... H01L 27/14603 |
| KR | 20210145492 A | * | 12/2021 | ............. H04N 25/76 |

*Primary Examiner* — Scott B Geyer
(74) *Attorney, Agent, or Firm* — Christensen O'Connor Johnson Kindness PLLC

(57) ABSTRACT

An image sensor including a plurality of photodiodes disposed within a semiconductor substrate proximate to a first side of the semiconductor substrate, a first transfer gate and a second transfer gate that are each disposed proximate to the first side of the semiconductor substrate and coupled to a respective one of the plurality of photodiodes, and a floating diffusion region coupled to the first transfer gate and the second transfer gate is described. The first transfer gate is laterally separated from the second transfer gate by a separation distance. The floating diffusion region extends laterally within the semiconductor substrate a distance greater than the separation distance between the first transfer gate and the second transfer gate. The floating diffusion region includes a central portion surrounded by a peripheral portion. A first dopant concentration of the central portion is greater than a second dopant concentration of the peripheral portion.

20 Claims, 8 Drawing Sheets

(56) References Cited

U.S. PATENT DOCUMENTS

2023/0246042 A1* 8/2023 Kurihara ............. H10F 39/8033
                                               250/208.1
2024/0014229 A1* 1/2024 Kubo ................ H10F 39/80373
2024/0038815 A1* 2/2024 Yamashita .......... H10F 39/8023

* cited by examiner

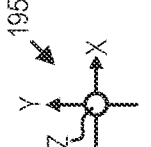
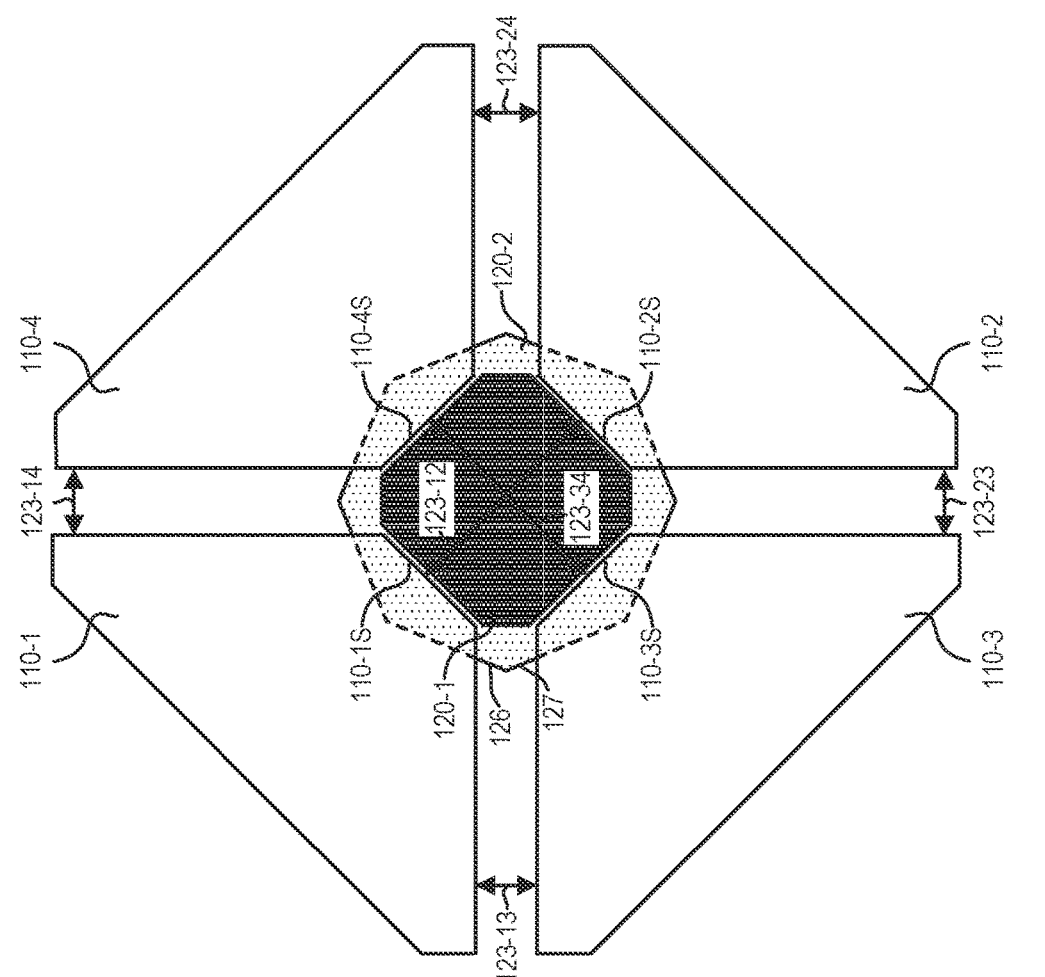
FIG. 1C

200

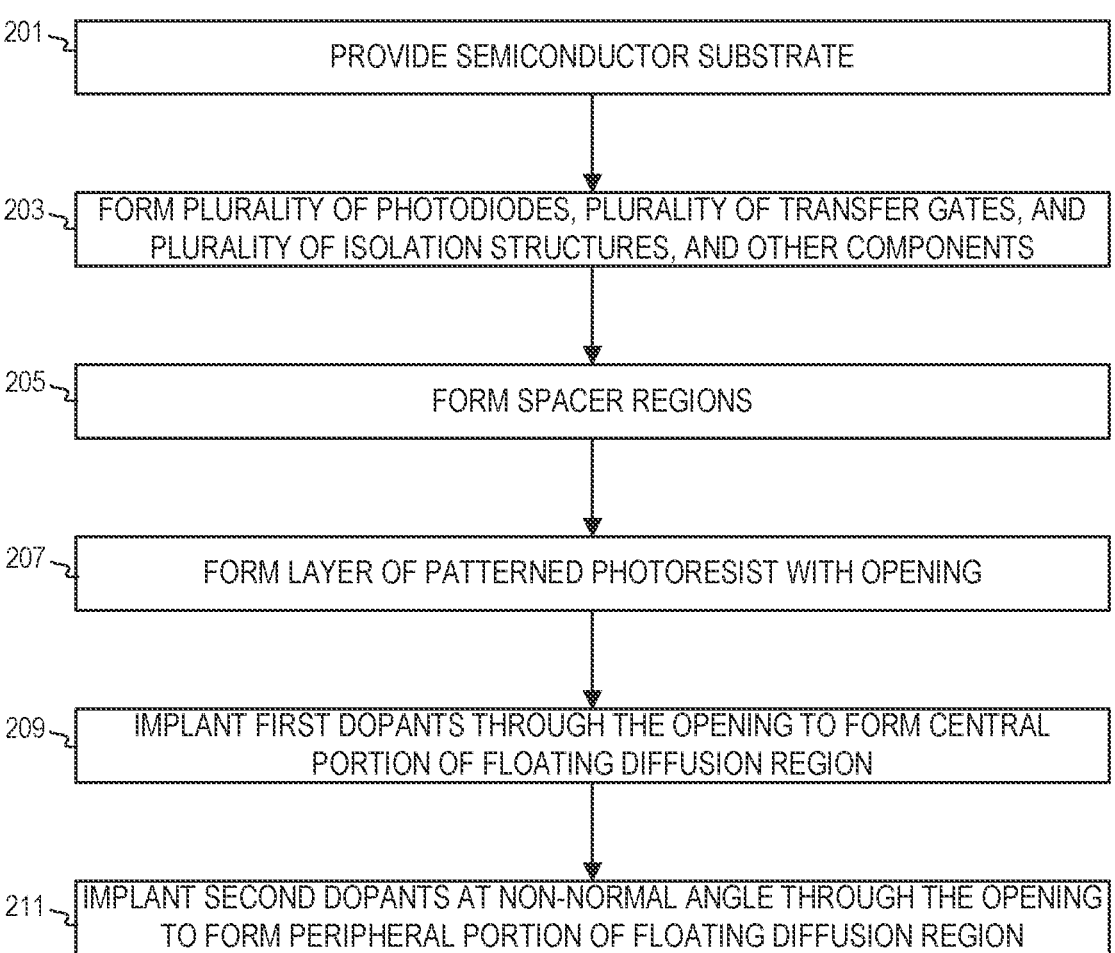

201 — PROVIDE SEMICONDUCTOR SUBSTRATE

203 — FORM PLURALITY OF PHOTODIODES, PLURALITY OF TRANSFER GATES, AND PLURALITY OF ISOLATION STRUCTURES, AND OTHER COMPONENTS

205 — FORM SPACER REGIONS

207 — FORM LAYER OF PATTERNED PHOTORESIST WITH OPENING

209 — IMPLANT FIRST DOPANTS THROUGH THE OPENING TO FORM CENTRAL PORTION OF FLOATING DIFFUSION REGION

211 — IMPLANT SECOND DOPANTS AT NON-NORMAL ANGLE THROUGH THE OPENING TO FORM PERIPHERAL PORTION OF FLOATING DIFFUSION REGION

FLOATING DIFFUSION REGION FORMED VIA SHARED PHOTOMASK AND METHODS THEREOF

TECHNICAL FIELD

This disclosure relates generally to complementary metal-oxide semiconductor devices, and in particular but not exclusively, relates to CMOS image sensors.

BACKGROUND INFORMATION

Image sensors are a type of complementary metal-oxide semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through improvements in device architecture design, manufacturing processes, image acquisition, and image processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIG. 1C illustrates the top view of the example pixel cell shown in FIG. 1A simplified to illustrate a central portion surrounded by a peripheral portion of a floating diffusion region, in accordance with embodiments of the present disclosure.

FIG. 2 illustrates a method for forming an image sensor with a floating diffusion region formed via a shared photomask, in accordance with embodiments of the present disclosure.

DETAILED DESCRIPTION

Figure 1A:
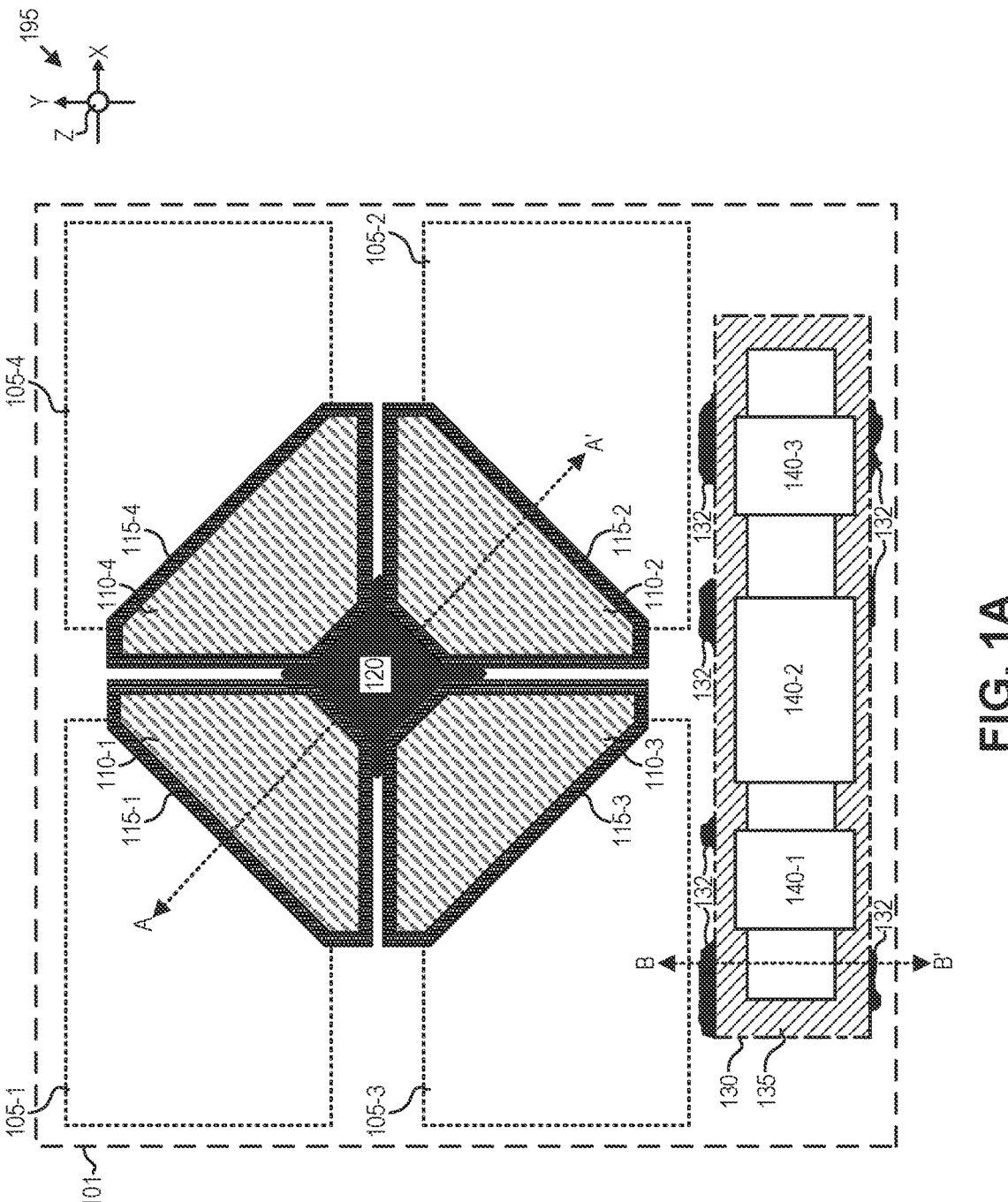
FIG. 1A illustrates a top view of an example pixel cell included in a pixel cell array of an image sensor, in accordance with embodiments of the present disclosure.

Embodiments of an apparatus, system, and method each related to an image sensor with a floating diffusion region that may be formed via a shared photomask are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Active pixels of complementary metal-oxide-semiconductor (CMOS) image sensors include a floating diffusion region that corresponds to a high conductivity region within the semiconductor substrate that is utilized to store photo-generated carriers (e.g., image charge) for readout (e.g., via a standard 4T pixel architecture). More specifically, image charge (e.g., photogenerated charge carriers accumulated within a given photodiode during an exposure period in response to incident light) may be transferred from the given photodiode to the floating diffusion region in response to a transfer signal applied to gate of a transfer transistor. The transferred image charge may then be read out using a source-follower transistor to determine a voltage representative of the image charge as known by one skilled in the art. Performance metrics of image sensors include floating diffusion leakage (e.g., charge leakage from the floating diffusion region) and blooming (e.g., electrical crosstalk, which may correspond to a floating diffusion region of a given pixel receiving charge from the photodiode of an adjacent or neighboring pixel).

Described herein are embodiments of pixel cells of an image sensor with floating diffusion regions that include a central portion having a first doping concentration and a peripheral portion laterally surrounding the central portion having a second doping concentration different from the first doping concentration. The pixel cells are structured to be formable using a common photomask while still being capable of adjusting floating diffusion leakage and blooming characteristics of a given pixel cell. It is appreciated that using a common or shared photomask (e.g., the same layer of patterned photoresist may be used for forming both the central portion and the peripheral portion of the floating diffusion region) advantageously provides a significant cost and time savings when forming the floating diffusion region since conventional processes for floating diffusion region formation may require two or more photomasks and their corresponding intermediary steps (e.g., photoresist deposition, patterning, curing, stripping, and the like).

In most embodiments, the floating diffusion region will be formed by implanting dopants through one or more openings formed by a layer of patterned photoresist at different angles with respect to a planar surface or side (e.g., front side or backside) of the semiconductor substrate the floating diffusion region is formed therein. It is appreciated that angled implantation provides precise control of dopant concentration, which is particularly useful when the pixel cell includes a plurality of photodiodes (e.g., when the floating diffusion region is coupled to or otherwise shared by more than one photodiodes). Additionally, by forming the floating diffusion region using a common or shared photomask without forming intermediary structures (e.g., spacers) between implantation steps, there is a reduced likelihood of defects and/or impurities being present between the central and peripheral portions of the floating diffusion region (e.g., the processes for forming intermediary structures may increase the likelihood that a defect or impurity may be formed within or proximate to the floating diffusion region).

FIG. 1A illustrates a top view of an example pixel cell 100 included in a pixel cell array of an image sensor, in accordance with embodiments of the present disclosure. The example pixel cell 100 includes a semiconductor substrate 101, a plurality of photodiodes 105, including a first photodiode 105-1, a second photodiode 105-2, a third photodiode 105-3, and a fourth photodiode 105-4, a plurality of transfer gates 110, including a first transfer gate 110-1, a second transfer gate 110-2, a third transfer gate 110-3, and a fourth transfer gate 110-4, a plurality of spacer regions 115, including a first spacer region 115-1, a second spacer region 115-2, a third spacer region 115-3, and a fourth spacer region 115-4, a floating diffusion region 120, a device region 130, and doped regions 132. The device region 130 includes an isolation structure 135 and a plurality of gate electrodes 140, including a first gate electrode 140-1, a second gate electrode 140-2, and a third gate electrode 140-3. As indicated by coordinate system 195, the top view of the example pixel cell 100 corresponds to a plane view or projection onto the x-y plane with respect to a side of the semiconductor substrate 101 (e.g., a front side or a backside).

In embodiments of the disclosure, the semiconductor substrate 101 includes or is otherwise formed of silicon, a silicon germanium alloy, germanium, a silicon carbide alloy, an indium gallium arsenide alloy, any other alloys formed of III-V group compounds, combinations thereof, or a bulk substrate thereof. In some embodiments, the semiconductor substrate 101 is an intrinsic semiconductor (e.g., undoped) while in other embodiments, the semiconductor substrate 101 is an extrinsic semiconductor (e.g., the semiconductor substrate 101 is a p-type or an n-type semiconductor, where "p" and "n" indicate a conductivity type of the semiconductor substrate 101). In some embodiments, the semiconductor substrate 101 includes an epitaxial layer grown thereon for the plurality of photodiodes 101 to be formed therein. In one or more embodiments, the semiconductor substrate 101 may be described as having a bulk dopant concentration, which corresponds to a background or baseline doping characteristic of the semiconductor substrate 101 (e.g., the bulk dopant concentration may describe the baseline intrinsic or extrinsic doping characteristics). In the same or other embodiments, the bulk doping concentration may correspond to the dopant concentration of the epitaxial layer grown on the semiconductor substrate 101. It is further appreciated that the term "semiconductor substrate" throughout the disclosure may correspond to a part of or an entirety of a semiconductor wafer or die (e.g., formed of one or more of the aforementioned materials).

The plurality of photodiodes 105 are disposed within the semiconductor substrate 101 proximate to a first side (e.g., a front side or a backside) of the semiconductor substrate 101, and including the first photodiode 105-1, the second photodiode 105-2, the third photodiode 105-3, and the fourth photodiode 105-4 arranged in a two-by-two photodiode array. In some embodiments, the plurality of photodiodes 105 may be electrically isolated from each other by isolation structures such as oxide-filled trench structures and/or junction isolation structures (e.g., deep trench isolation structures, shallow trench isolation structures, or other isolation structures that may laterally surround individual photodiodes included in the plurality of photodiodes 105 within the semiconductor substrate 101 to electrically isolate the individual photodiodes). It is appreciated that while the illustrated embodiment shows the pixel cell 100 including exactly four photodiodes included in the plurality of photodiodes 105, additional or fewer photodiodes may be included in the pixel cell 100, in accordance with embodiments of the disclosure. As illustrated, the first photodiode 105-1 is disposed adjacent to the third photodiode 105-3 and the fourth photodiode 105-4 without any intervening photodiodes. The second photodiode 105-2 is disposed adjacent to the third photodiode 105-3 and the fourth photodiode 105-4 without any intervening photodiodes. The first photodiode 105-1 is disposed diagonally from the second photodiode 105-2 without any intervening photodiodes. The third photodiode 105-3 is disposed diagonally from the fourth photodiode 105-4 without any intervening photodiodes. Each individual photodiode (e.g., 105-1, 105-2, 105-3, 105-4, or other instances thereof) is a photosensitive element (e.g., a pinned photodiode) comprising one or more doped regions of the semiconductor substrate 101 that collectively and/or in combination with the semiconductor substrate 101 form a PN junction within the semiconductor substrate 101 capable of photogenerating charge carriers responsive to an intensity of light incident upon the individual photodiode included in the pixel cell 100. As illustrated, individual photodiodes (e.g., 105-1, 105-2, 105-3, and/or 105-4) included in the plurality of photodiodes 105 have a shape corresponding to a rectangle. However, in the same or other embodiments, the plurality of photodiodes 105 may assume triangular, trapezoidal, pentagonal, hexagonal, heptagonal, octagonal, rhomboid, square or other shapes such as regular or irregular polygons. In some embodiments, individual photodiodes included in the plurality of photodiodes 105 may extend under a corresponding one of the plurality of transfer gates 110 (e.g., the first photodiode 105-1 is disposed, at least in part, under the first transfer gate 115-1, the second photodiode 105-2 is disposed, at least in part, under the second transfer gate 115-2, and so on).

The plurality of transfer gates 110 are disposed proximate to the first side of the semiconductor substrate 101 and include the first transfer gate 110-1, the second transfer gate 110-2, the third transfer gate 110-3, and the fourth transfer gate 110-4 arranged around the floating diffusion region 120 to couple (e.g., electrically) the floating diffusion region 120 to a respective one of the plurality of photodiodes 105 included in the pixel cell (e.g., the first transfer gate 110-1 couples the first photodiode 105-1 to the floating diffusion region 120, the second transfer gate 110-2 couples the second photodiode 105-2 to the floating diffusion region 120, and so on). Accordingly, there is a one-to-one ratio between the number of photodiodes included in the plurality of photodiodes 105 and the number of transfer gates included in the plurality of transfer gates 110. Similarly, since the floating diffusion region 120 is shared by the plurality of photodiodes 105, the number of photodiodes included in the plurality of photodiodes 105 and the number of transfer gates included in the plurality of transfer gates 110 are each greater than the one floating diffusion region 120 included in the pixel cell 100. It is appreciated that while the illustrated embodiment shows the pixel cell 100 including exactly four transfer gates included in the plurality of transfer gates 110, additional or fewer transfer gates may be included in the pixel cell 100, in accordance with embodiments of the disclosure.

As illustrated, the first transfer gate 110-1 is disposed adjacent to the third transfer gate 110-3 and the fourth transfer gate 110-4 without any intervening transfer gates. The second transfer gate 110-2 is disposed adjacent to the third transfer gate 110-3 and the fourth transfer gate 110-4 without any intervening transfer gates. The first transfer gate 110-1 is disposed diagonally from the second transfer gate 110-2 without any intervening transfer gates. The third transfer gate 110-3 is disposed diagonally from the fourth transfer gate 110-4 without any intervening transfer gates. In some embodiments, the plurality of transfer gates 110 are electrically isolated from each other. For example, the first transfer gate 110-1 is electrically isolated from the second transfer gate 110-2, the third transfer gate 110-3, and the fourth transfer gate 110-4. The second transfer gate 110-2 is electrically isolated from the first transfer gate 110-1, the third transfer gate 110-3, and the fourth transfer gate 110-4. The third transfer gate 110-3 is electrically isolated from the first transfer gate 110-1, the second transfer gate 110-2, and the fourth transfer gate 110-4. The fourth transfer gate 110-4 is electrically isolated from the first transfer gate 110-1, the second transfer gate 110-2, and the third transfer gate 110-3. In other words, individual transfer gates included in the plurality of transfer gates 110 are distinct and separated from one another (e.g., not in direct physically contact with one another).

In the illustrated embodiment, the plurality of transfer gates 110 are arranged in a two-by-two transfer gate array with each transfer gate included in the plurality of transfer gates 110 having a shape corresponding to an irregular hexagon (i.e., a hexagon with different length sides). However, it is appreciated that in other embodiments, the shape of the plurality of transfer gates 110 may be different, including, trapezoidal, pentagonal, hexagonal, heptagonal, octagonal, rhomboid, rectangular, square or other shapes such as regular or irregular polygons. In some embodiments, individual transfer gates included in the plurality of transfer gates 110 may extend over a corresponding one of the plurality of photodiodes 106 (e.g., the first transfer gate 110-1 is disposed, at least in part, over the first photodiode 105-1, the second transfer gate 110-2 is disposed, at least in part, over the second photodiode 105-2, and so on) and the floating diffusion region 120 (e.g., the plurality of transfer gates 110 is disposed, at least in part, over the floating diffusion region 120).

The plurality of spacer regions 115 include the first spacer region 115-1, the second spacer region 115-2, the third spacer region 115-3, and the fourth spacer region 114, which laterally surround the plurality of transfer gates 110, respectively (e.g., the first spacer region 115-1 laterally surrounds the first transfer gate 110-1, the second spacer region 115-2 laterally surrounds the second transfer gate 110-2, and so on). In other words, the plurality of spacer regions 115 extend from, or are otherwise disposed proximate to, sidewalls of the plurality of transfer gates 110, such that portions of the plurality of spacer regions 115 are disposed between the plurality of transfer gates 110 (e.g., portions of the first spacer region 115-1 and the second spacer region 115-2 are disposed between the first transfer gate 110-1 and the second transfer gate 110-2, portions of the first spacer region 115-1 and the third spacer region 115-3 are disposed between the first transfer gate 110-1 and the third transfer gate 110-3, portions of the first spacer region 115-1 and the fourth spacer region 115-4 are disposed between the first transfer gate 110-1 and the fourth transfer gate 110-4, and so on). Accordingly, the plurality of spacer regions 115 may have a shape matched (i.e., a common shape) to the plurality of transfer gates 110. The plurality of spacer regions 115 may be formed of, or otherwise include, a dielectric material such as silicon dioxide, silicon nitrides, an oxynitride, other insulating materials, or combinations thereof (e.g., in the form of a multilayer spacer) to provide additional isolation for leakage control (e.g., between the plurality of photodiodes 105 and the floating diffusion region 120).

The floating diffusion region 120 is positioned (e.g., surrounded by the plurality of transfer gates 110 when viewed from the top view of FIG. 1A) the plurality of transfer gates 110 to collect image charge generated by the plurality of photodiodes 105, which can then be readout, at least in part, via the device region 130 of the pixel cell 100. The floating diffusion region is disposed within the semiconductor substrate 101 and corresponds to a high conductivity region formed via two or more implantation steps using a shared photomask (see, e.g., method 200 illustrated in FIG. 2). It is appreciated that the floating diffusion region has a first conductivity type that is equivalent to a second conductivity type of the plurality of photodiodes 105 (e.g., p-type or n-type), which is opposite of a third conductivity type (e.g., n-type or p-type) of the semiconductor substrate 101 or a well (e.g., an n-well or a p-well) the components of the pixel cell 100 may be formed therein.

The device region 130 corresponds to a portion of the pixel cell 100 defined by isolation structure 135 (e.g., a shallow trench isolation structure or a deep trench isolation structure), which is where one or more transistors for readout of the pixel cell 100 may reside or otherwise be disposed proximate. In the illustrated embodiment, the device region 103 is defined by a perimeter boundary of the isolation structure 135, which has a rectangular shape and is disposed proximate to the second photodiode 105-2, the third photodiode 105-3, the second transfer gate 110-2, the third transfer gate 105-3, the second spacer region 115-2, and the third spacer region 115-3. However, in other embodiments, the device region 130 and/or the isolation structure 135 may have a different shape and/or position within the pixel cell 100 depending on pixel size and layout arrangement. In most embodiments, the isolation structure 135 corresponds to a shallow trench isolation (STI) structure disposed proximate to a surface of the semiconductor substrate 101 that has transistor gates disposed thereon. In other embodiments, the isolation structure 135 is a deep trench isolation structure. In some embodiments, the isolation structure 135 may be formed from a trench filled with a dielectric material, or otherwise include silicon dioxide, other dielectric materials (e.g., HfO$_2$, or other insulating materials having a dielectric constant greater than a corresponding dielectric constant of silicon dioxide), polycrystalline silicon, or combinations thereof.

The one or more transistors may include a row select transistor, a source-follower transfer, a reset transistor, which collectively, with the transfer transistors formed by the plurality of transfer gates 110, may form pixel control circuitry similar to the 4T pixel architecture for reading out photogenerated charge carriers generated by the plurality of photodiodes 110 in response to incident light. For example, the plurality of gate electrodes 140 included in the device region 130 may include a row select gate of a reselect transistor, a source-follower gate of a source-follower transistor, or a reset gate of a reset transistor, which may respectively correspond to the first gate electrode 140-1, the second gate electrode 140-2, and the third gate electrode 140-3. However, it is appreciated that not all gate electrodes included in the pixel cell 100 are necessarily illustrated. For example, the plurality of gate electrodes 140 may include additional gate electrodes for transistors included in conversion gain circuitry (e.g., dual floating diffusion transistor or switchable conversion gain transistor), transistors coupled to memory elements, and other transistors (e.g., for 3T, 5T, 6T, or other higher transistor count pixel architectures). In some embodiments, the gate electrodes (e.g., the plurality of transfer gates 110, the plurality of gate electrodes 140, or other gate electrodes included in the pixel cell 100) may be formed of polycrystalline silicon (extrinsic or intrinsic), metal (e.g., one or more of Al, Cu, Au, Ag, Ti, Ta, Nb), metal alloys (e.g., TaN, WN$_x$, other metal nitrides, RuO$_x$, or other metal oxide gate electrode materials), or combinations thereof.

In some embodiments, doped regions 132 may be disposed around (e.g., outside of) the device region 130 proximate to the isolation structure 135. In other words, the doped regions 132 are not disposed within the device region 130 nor surrounded by the isolation structure 135. At least one of the doped regions 132 may be disposed within the semiconductor substrate 101 between the isolation structure 130 and one of the plurality of photodiodes 105 (e.g., a nearby photodiode such as the second photodiode 105-2, the third photodiode 105-3, or other nearby photodiodes included in the plurality of photodiodes 110 depending on an arrangement of the device region 130 within the pixel cell 100). At least one of the doped regions 132 may be disposed within the semiconductor substrate 101 between the isolation structure 130 and the at least one of the plurality of transfer gates 110 (e.g., the second transfer gate 110-2, the third transfer gate 110-3, or other nearby transfer gates included in the plurality of transfer gates 110 depending on an arrangement of the device region 130 within the pixel cell 100). In some embodiments at least one of the doped regions 132 may be disposed within the semiconductor substrate 101 in a well region between the isolation structure 130 and one or more nearby photodiodes included in the plurality of photodiodes 105. In some embodiments, the well region has an opposite conductivity type to that of the doped region 132 (e.g., the doped region 132 may have a type of conductivity the same as the source/drain and floating diffusion region such as an n-type conductivity while the well region has a p-type conductivity or vice versa).

In some embodiments, the doped regions 132 are resultant from forming the floating diffusion region 120 using a common or shared photomask. Specifically, implantation for source/drain regions of transistors included in the device region 130 (e.g., source or drain regions disposed within the device region 130 and coupled to one or more gate electrodes included in the plurality of gate electrodes 140) may be formed simultaneously when forming the floating diffusion region 120.

In other words, the doped regions 132 are structures from the advantageous process of forming the floating diffusion region 120 with multiple implantation steps using a single or common photomask or layer of patterned photoresist, in accordance with embodiments of the disclosure. As discussed previously and subsequently in greater detail, the floating diffusion 120 region may include at least two implantation steps using a common mask or layer of patterned photoresist, in which at least one of the at least two implantation steps may be accomplished via implantation at a non-normal angle with respect to a side or surface of the semiconductor substrate. The same implantation step with the non-normal angle may be simultaneously utilized to form source/drain regions of the device region 135, which may result in the formation of the doped regions 132. Accordingly, it is appreciated that a common dopant (e.g., one or more of the dopant types utilized to form the floating diffusion region 120) may be included in the doped regions 132 proximate to the isolation structure 130. However, it is appreciated that a dopant concentration of the common dopant within the doped regions 132 may be one or more orders of magnitude less than a bulk dopant concentration of a bulk dopant included in or proximate to the doped regions 132 (e.g., the bulk dopant concentration and type of the semiconductor substrate 101 and/or a well isolation region the doped regions 132 are disposed therein). The difference in the dopant concentration of the common dopant and the bulk dopant concentration combined with the fact that the common dopant and the bulk dopant have opposite conductivity types means that the doped regions 132 are effectively counter doped such that the bulk dopants compensate for the common dopants within the doped regions 132 and inhibit adverse effects (e.g., leakage, dark current, and/or white pixel issues) on operation of the pixel cell 100.

Figure 1B:
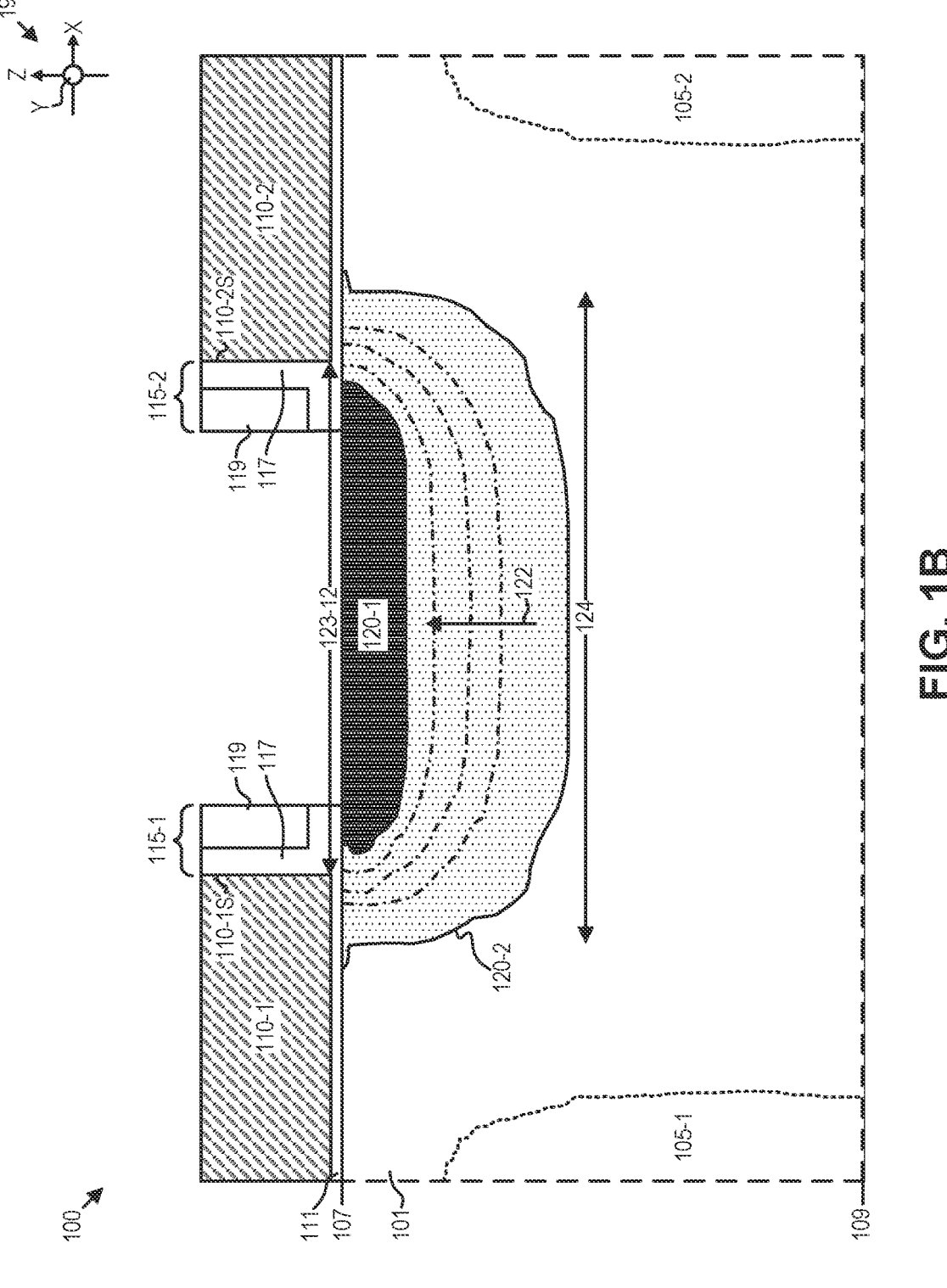
FIG. 1B illustrates a cross-sectional view of the example pixel cell along line A-A' shown in FIG. 1A, in accordance with embodiments of the present disclosure.

FIG. 1B illustrates a cross-sectional view 100-AA' of the example pixel cell 100 along line A-A' shown in FIG. 1A, in accordance with embodiments of the present disclosure. The illustrated view of the pixel cell 100 includes the semiconductor substrate 101, the first photodiode 105-1, the second photodiode 105-2, the first transfer gate 110-1, the second transfer gate 110-2, gate dielectric 111, the first spacer region 115-1, the second spacer region 115-2, and the floating diffusion region 120. The first spacer region 115-1 and the second spacer regions 115-2 each include a first material 117 and a second material 119. The floating diffusion region 120 includes a central portion 120-1 surrounded by a peripheral portion 120-2.

In the illustrated embodiment, the first material 117 and/or the second material 119 correspond to material layers that form the plurality of spacer regions 115, which may include a dielectric material such as silicon dioxide, silicon nitrides, an oxynitride, other insulating materials, or combinations thereof to provide additional isolation for leakage control (e.g., from the floating diffusion region 120). In one embodiment, the first spacer region 115-1 and the second spacer region 115-2 are disposed between sidewall 110-1S of the first transfer gate 110-1 and sidewall 110-2S of the second transfer gate 110-2. In some embodiments, the first spacer region 115-1 extends from and directly contacts the sidewall 110-1S of the first transfer gate 110-1 while the second spacer 115-2 extends from and directly contacts sidewall 110-2S of the second transfer gate 110-2. In one or more embodiments, the first material 117 of the first spacer region 115-1 is disposed between the second material 119 of the first spacer region 115-1 and the sidewall 110-1S of the first transfer gate 110-1. In the same or other embodiments, the first material 117 of the second spacer region 115-2 is disposed between the second material 119 of the second spacer region 115-2 and the sidewall 110-2S of the second transfer gate 110-2. In some embodiments, the first material 117 may have a common composition as the gate dielectric 111.

In the illustrated embodiment, the semiconductor substrate 101 includes a first side 107 (e.g., a front side or a backside) and a second side 109 (e.g., a backside or a front side). The gate dielectric 111 is disposed between the first side 107 of the semiconductor substrate and the plurality of transfer gates 110 (e.g., the first transfer gate 110-1 and the second transfer gate 110-2). Similarly, the gate dielectric 111 is disposed between the plurality of transfer gates 110 and the floating diffusion region 120.

As illustrated in FIG. 1B, the floating diffusion region 120 includes central portion 120-1 and peripheral portion 120-2. The peripheral portion 120-2 laterally surrounds the central portion 120-1. For example, the peripheral portion 120-2 is disposed between the central portion 120-1 and the first photodiode 105-1. Similarly, the peripheral portion 120-2 is disposed between the central portion 120-1 and the second photodiode 105-2. Additionally, the peripheral portion 120-2 extends under the central portion 120-1 such that central portion 120-1 is disposed between the first side 107 of the semiconductor substrate 101 and the peripheral portion 120-2. In the illustrated embodiment, the floating diffusion region 120 extends laterally within the semiconductor substrate 101 a distance 124 greater than a separation distance 123-12 (e.g., the lateral distance between sidewall 110-1S of the first transfer gate 110-1 and sidewall 110-2S of the second transfer gate 110-2). In some embodiments, a lateral extended distance of the peripheral portion 120-2 is greater than a lateral extended distance of the central portion 120-1. It is appreciated that the floating diffusion region 120 forms respective transfer transistors with the plurality of photodiodes 105 and the plurality of transfer gates 110. Accordingly, lateral extension of the floating diffusion region 120 is limited to the extent that there is a sufficient separation distance (e.g., which is dependent on the node size used to fabricate the pixel cell 100, configuration of the components of the pixel cell 100, inter alia) between the plurality of photodiodes 105 and the floating diffusion region 120 to form the transfer transistors with target performance characteristics. Accordingly, in some embodiments, the floating diffusion region 120 does not extend laterally beyond a channel length defined, at least in part, by the plurality of transfer gates 110 (e.g., the first transfer gate 110-1 or the second transfer gate 110-2).

It is appreciated that the central portion 120-1 and the peripheral portion 120-2 are formed using different ion implantation steps (see, e.g., method 200 illustrated in FIG. 2) using a common photomask or layer of patterned photoresist and are configured to have the same or different dopants at different dopant concentrations and/or doping profiles to facilitate performance optimization of the pixel cell 100 while reducing fabrication costs. Accordingly, in most embodiments, a first dopant concentration of a first dopant implanted into the central portion 120-1 of the floating diffusion region 120 is different than a second dopant concentration of a second dopant implanted into the peripheral portion 120-2 of the floating diffusion region. It is appreciated that dopant concentration corresponds to an amount (e.g., ions per unit volume) of dopant (e.g., the first or second dopants) implanted within a particular region or position of the semiconductor substrate 101. In most embodiments, the first dopant and the second dopant are the same impurity (e.g., B, Al, Ga, In, P, As, Sb, Bi, Li, group III or V elements, or combinations thereof) or other dopants known by one skilled in the relevant art that may be dependent on the material type of the semiconductor substrate 101). For example, if the semiconductor substrate 101 (or epitaxial layer) has a p-type conductivity, then the first and second dopants will be n-type dopants (e.g., P, As, or other donor impurities). In general, the first and second dopants will be of sufficient concentration such that the floating diffusion region 120 has the first conductivity type opposite of the third conductivity type of the semiconductor substrate 101.

In some embodiments, the first dopant concentration of the central portion 120-1 is greater than the second dopant concentration of the peripheral portion 120-2. For example, in one embodiment, the first dopant concentration is at least two orders of magnitude greater than the second dopant concentration. In one or more embodiments, the first dopant concentration of the central portion 120-1 may be substantially uniform (e.g., the first dopant concentration throughout the central portion 120-1 corresponds to a range of dopant concentrations that does not deviate by more than one order of magnitude). In other embodiments, the central portion 120-1 may be nonuniform (e.g., dopant concentration throughout the central portion 120-1 for the first dopant may corresponds to a range of dopant concentrations that deviates by more than one order of magnitude, more than two orders of magnitude, or higher).

In most embodiments, the peripheral portion 120-2 of the floating diffusion region 120 has a nonuniform doping concentration (e.g., the dopant concentration throughout the peripheral portion 120-24 for the second dopant corresponds to a range of dopant concentrations including the second dopant concentration and a third dopant concentration). It is appreciated that the dopant concentration of the second dopant throughout the peripheral portion 120-2 may deviate by more than one order of magnitude, two orders of magnitude, three orders of magnitude, four orders of magnitude, or higher, which is attributed, at least in part, to implantation being done at a non-normal angle with respect to the first side 107 of the semiconductor substrate 101. Accordingly, the second dopant concentration may correspond to a concentration of the second dopant proximate to the first transfer gate 110-1, the second transfer gate 110-2, and/or other transfer gates included in the plurality of transfer gates 110 and a third dopant concentration may correspond to a concentration of the second dopant proximate to the first spacer region 115-1, the second spacer region 115-2, and/or other spacer regions included in the plurality of spacer regions 115. In other words, the dopant concentration of the second dopant (i.e., the second dopant concentration) in the floating diffusion region 120 under the transfer gates 110 may be different than the dopant concentration of the second dopant (i.e., the third dopant concentration) in the floating diffusion region 120 under the plurality of spacer regions 115. In some embodiments, the third dopant concentration is greater than the second dopant concentration but less than the first dopant concentration (i.e., the dopant concentration of the first dopant within the central portion 120-1). In some embodiments, the concentration of the second dopant may increase from a perimeter or outer boundary of the peripheral portion 120-2 towards the central portion 120-1 as indicated by the dashed lines and arrow 122.

FIG. 1C illustrates the top view of the example pixel cell 100 shown in FIG. 1A simplified to illustrate the central portion 120-1 surrounded by the peripheral portion 120-2 of the floating diffusion region 120, in accordance with embodiments of the present disclosure. To aid in the discussion, certain elements have been omitted from the view of the pixel cell 100 illustrated in FIG. 1C, including, but not limited to, the plurality of photodiodes 105, the plurality of spacer regions 115, and the device region 130. Rather, the illustrated embodiment shows the plurality of transfer gates 110, including the first transfer gate 110-1, the second transfer gate 110-2, the third transfer gate 110-3, and the fourth transfer gate 110-4 and the floating diffusion region 120, including the central portion 120-1 and the peripheral portion 120-2.

As illustrated, the first transfer gate 110-1 is separated from the second transfer gate 110-2 by separation distance 123-12 while the third transfer gate 110-3 separated from the fourth transfer gate 110-4 by separation distance 123-34. The first transfer gate 110-1 is separated from the third transfer gate 110-3 and the fourth transfer gate 110-4 by separation distance 123-13 and separation distance 123-14, respectively. The second transfer gate 110-2 is separated from the third transfer gate 110-3 and the fourth transfer gate 110-4 by separation distance 123-23 and separation distance 123-24, respectively. In most embodiments, the separation distances 123-12, 123-13, 123-23, and 123-24 are substantially equal (e.g., within 5% or less or within 10% or less) to maximize space efficiency or utilization when the plurality of photodiodes 110 (not illustrated) are substantially (e.g., within 5% or less or within 10% or less) the same size. In other embodiments, one or more of the separation distances 123-12, 123-13, 123-23, and 123-24 are different from one another. In most embodiments, the separation distance 123-12 (e.g., distance between the first transfer gate 110-1 and the second transfer gate 110-2) and the separation distance 123-34 (e.g., distance between the third transfer gate 110-3 and the fourth transfer gate 110-4) is greater than at least one of separation distances 123-13, 123-14, 123-23, or 123-24. For example, in one embodiment, the separation distance 123-12 and the separation distance 123-34 are greater than each of separation distances 123-13, 123-14, 123-23, and 123-24.

In the illustrated embodiment of FIG. 1C, the central portion 120-1 of the floating diffusion region 120 has a shape that may be represented as an irregular octagon or circle when the pixel cell 100 is illustrated in a top view. The shape of the central portion 120-1 of the floating diffusion region 120 is matched to extend toward proximal edges (e.g., 110-1S, 110-2S, 110-3S, and 110-4S) of the plurality of transfer gates 110. However, it is appreciated that the central portion 120-1 may have other shapes dependent on the configuration of the pixel cell 100 (e.g., based on the shape and arrangement of the plurality of transfer gates 110). For example, the proximal edges (i.e., 110-1S, 110-2S, 110-3S, and 110-4S) of the first, second, third, and fourth transfer gates (i.e., 110-1, 110-2, 110-3, and 110-4) form a rectangular arrangement around the central portion 120-1 of the floating diffusion region 120. In other words, a pair of proximal edges adjacent to one another (e.g., 110-1S and 110-3S or 110-4S) are positioned at right angles with respect to one another. In the illustrated embodiment, the peripheral portion 120-2 of the floating diffusion region 120 has an octagonal or circular shape, which is attributed, at least in part, to the common photomask and/or layer of patterned photoresist utilized to form the central portion 120-1 and the peripheral portion 120-24 of the floating diffusion region 120 and the arrangement of the plurality of transfer gates 110. Specifically, the central portion 120-1 and the peripheral portion 120-2 of the floating diffusion region 120 are formed with different ion implantation operations using a common photomask. The different ion implantation operations use the common photomask to form a layer of patterned photoresist with an opening for forming the floating diffusion region 120. The peripheral portion 120-2 is formed during one of the different ion implantation operations via an angled ion implantation by implanting dopants at a non-normal angle with respect to the first side 107 of the semiconductor substrate 101. In some embodiments, an opening of the layer of patterned photoresist formed with the common photomask is substantially equal to the opening formed by the rectangular arrangement formed by the proximal edges of the plurality of transfer gates 110 (e.g., the shape of the opening may substantially correspond to the shape of the central portion 120-1). However, it is appreciated that in other embodiments, the opening of the layer of patterned photoresist formed with the common photomask may also incorporate the thickness of the plurality of spacer regions 115 (see, e.g., FIG. 1A), such that the opening does not expose the plurality of transfer gates 110 or the plurality of spacer regions 115 when conducting ion implantation operations for forming the floating diffusion region 120.

Referring back to FIG. 1C, a first edge 126 and a second edge 127 of the peripheral portion 120-2 converge between the first transfer gate 110-1 and the third transfer gate 110-3. It is appreciated that other edges of the peripheral portion 120-2 may also converge between adjacent transfer gates included in the plurality of transfer gates 110 and/or under one or more of the plurality of transfer gates 110. Accordingly, the peripheral portion 120-2 narrows (e.g., forms an extension tip where the width of the peripheral portion 120-2 decreases as the peripheral portion 120-2 extends from the central portion 120-1) between the first transfer gate 110-1 and the third transfer gate 110-3. Similarly, the peripheral portion 120-2 also narrows between the first transfer gate 110-1 and the fourth transfer gate 110-4, between the second transfer gate 110-2 and the third transfer gate 110-3, and between the second transfer gate 110-2 and the fourth transfer gate 110-4. Additionally, the peripheral portion 120-2 narrows under the first transfer gate 110-1, the second transfer gate 110-2, the third transfer gate 110-3, and the fourth transfer gate 110-4. It is further appreciated that the concentration of the second dopant used to form the peripheral portion 120-2 may change substantially (e.g., by two or more orders of magnitude) depending on where the concentration is measured within the peripheral portion 120-2. For example, a fourth dopant concentration of the peripheral portion 120-2 of the second dopant measured proximate to where the peripheral portion 120-2 narrows between adjacent pairs of the plurality of transfer gates 110 (e.g., the regions where the peripheral portion 120-2 forms extension tips between transfer gates included in the plurality of transfer gates 110) may be less than the first dopant concentration of the central portion 120-1, the second dopant concentration of the peripheral portion 120-2 (e.g., portion under one or more of the plurality of transfer gates 110), and the third dopant concentration of the peripheral portion 120-2 (e.g., portion under one or more of the plurality of spacer regions 115).

It is appreciated that the phrase "between" for certain embodiments of the disclosure is taken in context when viewed from a top-view perspective (e.g., as illustrated in FIG. 1A and FIG. 1C). Thus, even though certain features are described as being between one another, said features are not necessarily along the same z-axis as indicated by coordinate system 195 and illustrated in FIG. 1B and FIG. 1D). For example, the peripheral portion 120-2 of the floating diffusion region 120 narrows between the first transfer gate 110-1 and the third transfer gate 110-3, but lie at different z-positions in accordance with embodiments of the disclosure (e.g., the plurality of transfer gates 110 are formed over or on top of the semiconductor substrate 101 while the floating diffusion region 120 is formed within the semiconductor substrate 101). Similarly, the central portion 120-1 of the floating diffusion region 120 is disposed within the semiconductor substrate 101 between proximal edges (110-1S, 110-2S, 110-3S, and 110-4S) of the plurality of transfer gates 110 as shown in FIG. 1C while at different z-positions as shown in FIG. 1B.

Figure 1D:
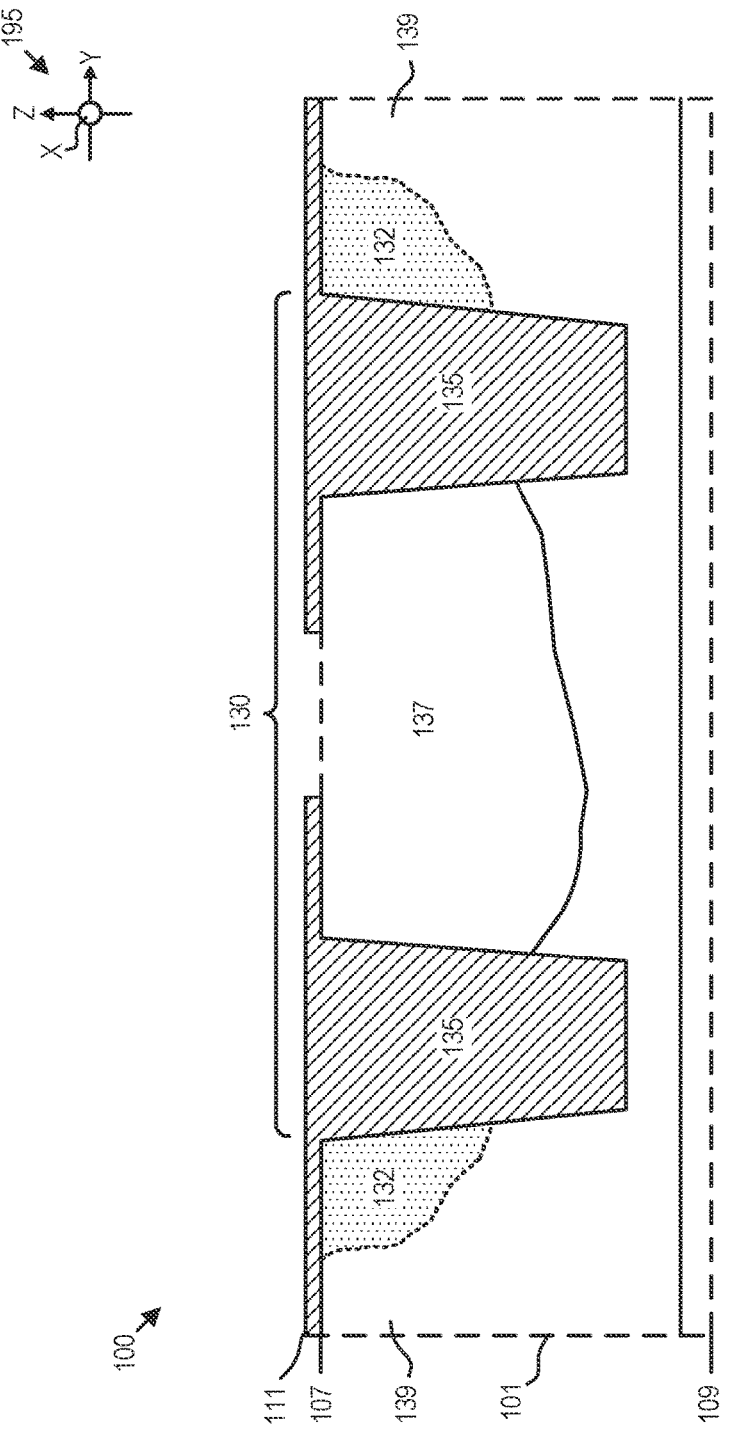
FIG. 1D illustrates a cross-sectional view of the example pixel cell along line B-B' shown in FIG. 1A, in accordance with embodiments of the present disclosure.

FIG. 1D illustrates a cross-sectional view 100-BB' of the example pixel cell 100 along line B-B' shown in FIG. 1A, in accordance with embodiments of the present disclosure. Specifically, the cross-sectional view 100-BB' illustrates a portion of the device region 130, which illustrates a source/drain region 137 of a transistor included in the device region 130 (e.g., formed with the plurality of gate electrodes 140) illustrated in FIG. 1A. As illustrated in FIG. 1D, the isolation structure 135 (e.g., a shallow trench isolation structure or a deep trench isolation structure) extends from the first side 107 of the semiconductor substrate 101 and is disposed between the first side 107 and the second side 109 of the semiconductor substrate 101 (e.g., the first side 107 of the semiconductor substrate 101 is disposed between the gate dielectric 111 and the isolation structure 135). Disposed between trenches of the isolation structure 135 is source/drain region 137, which may be formed, at least in part, during the same ion implantation process that is used to form the peripheral portion 120-2 of the floating diffusion region 120 illustrated in FIG. 1A and FIG. 1C. In some embodiments, the illustrated portion of the source/drain region 137 corresponds to a lightly doped drain region (e.g., n- or p- when the peripheral portion 120-2 of the floating diffusion region 120 illustrated in FIG. 1B and FIG. 1C is n- or p-). Advantageously, the angled ion implantation process used to form the peripheral portion 120-2 may also be used to concurrently form the lightly doped drain regions (e.g., portion of source/drain region 137). However, it is appreciated that in doing so, doped regions 132 may be formed proximate to the isolation structure 135 outside of the device region 130. In other words, the doped regions 132 may extend laterally (e.g., along the Y-direction indicated by the coordinate system 195 as illustrated in FIG. 1D) beyond the corresponding isolation structure 135 (i.e., the doped regions 132 may be disposed in the semiconductor substrate 101 outside of the device region 130). In some embodiments, the doped regions 132 are disposed within the well 139 and further disposed between the isolation structure 135 and one of the plurality of photodiodes (e.g., the plurality of photodiodes 105 when FIG. 1D is viewed in context of FIG. 1A). As discussed previously, the doped regions 132 may be disposed within an isolation or passivation implant region (e.g., corresponding to a well formed in the semiconductor substrate 101 via implantation such as well 139). In some embodiments, the well 139 and the doped regions 132 have opposite conductivity types (e.g., the doped regions 132 includes an n-type dopant while the well 139 includes a p-type dopant or vice versa). In the same or other embodiments, the doped regions 132 have a dopant concentration (e.g., of the n-type dopant) that is at least an order of magnitude less than a dopant concentration (e.g., of the p-type dopant) than the well 139 such that the dopants of the well 139 counter-dope or otherwise compensate for the dopants of the doped region 139 (e.g., since the doped regions 132 are formed within the well 139 then the location of the doped regions 132 within the semiconductor substrate 101 includes at least two types of dopants having opposite conductivity types). In other words, the dopants of the well 139 may compensate for the dopants introduced during the angled ion implantation process proximate to the isolation structure such that the doped regions 132 are effectively counter doped and do not appreciably affect leakage, dark current, and/or white pixel characteristics of the pixel cell 100.

It is appreciated that embodiments of the present disclosure may include one or more dielectric or insulating materials (e.g., the gate dielectric 111, plurality of spacer regions 115, and isolation structure 135, and so on), which may have a composition including one or more dielectric materials. In some embodiments, the one or more dielectric materials may include oxides, nitrides, and/or silicates such as silicon dioxide ($SiO_2$), hafnium oxide ($HfO_2$), hafnium silicate ($HfSi_xO_y$), nitride hafnium silicate (HfSiON), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($LuzO_3$), yttrium oxide ($Y_2O_3$), a combination thereof, or the like. Additionally, one skilled in the relevant art, will recognize that any stoichiometric combination of the above metals/semiconductors and their oxides/nitrides/oxynitrides may be used, in accordance with embodiments of the present disclosure.

FIG. 2 illustrates a method 200 for forming an image sensor with a floating diffusion region formed via a shared photomask, in accordance with embodiments of the present disclosure. The image sensor may include one or more of, or an array of, pixel cells, each individual pixel cell included in the one or more pixel cells or the array of pixel cells corresponding to instances of the pixel cell 100 illustrated in FIGS. 1A-1D. In other words, the method 200 is one possible way the pixel cell 100 and the various embodiments of the pixel cell 100 described herein may be formed or otherwise manufactured. It is appreciated that while the process blocks of the method 200 illustrated in FIG. 2 are provided in a specific order, in other embodiments a different order of blocks 201, 203, 205, 207. 209, and 211 may be utilized. Additionally, process blocks may be added to, or removed from, the method 200 in accordance with the embodiments of the present disclosure. The process blocks illustrated in the method 200 may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, wet etching, and the like. It is appreciated that the described techniques are merely demonstrative and not exhaustive and that other techniques may be utilized to fabricate one or more components of various embodiments of the disclosure.

Block 201 illustrates providing a semiconductor substrate (e.g., the semiconductor substrate 101) that may be used to form an image sensor or other complementary metal-oxide semiconductor device that includes one or more pixel cells or an array thereof (e.g., corresponding to the pixel cell 100). It is appreciated that the semiconductor substrate may be provided to one or more machines or other pieces of equipment for fabrication (e.g., for applying one or more conventional semiconductor device processing and microfabrication techniques). In some embodiments, the semiconductor substrate may be an intrinsic or extrinsic semiconductor wafer or a wafer substrate having epitaxial layer grown thereon that may be prepopulated with one or more components or structures (e.g., wells), or the like.

Block 203 shows forming a plurality of photodiodes within the semiconductor substrate proximate to a first side of the semiconductor substrate (e.g., the plurality of photodiodes 105 formed within the semiconductor substrate 101 proximate to the first side 107), forming a plurality of transfer gates (e.g., the plurality of transfer gates 110), forming a plurality of isolation structures (e.g., the isolation structure 135), and other components (e.g., the plurality of gate electrodes 140). Each of the aforementioned components may be formed using one or more photomasks with different process sequences using conventional semiconductor device processing and microfabrication techniques. The plurality of photodiodes, for example, may be formed utilizing one or more ion implantation processes to implant a predetermined number of ions (e.g., B, Al, Ga, In, P, As, Sb, Bi, Li, group III or V elements, or combinations thereof) within a specified region of the semiconductor substrate to achieve a targeted doping profile. The plurality of isolation structures may be formed by etching one or more trenches and backfilling the one or more trenches with the appropriate materials (e.g., dielectric or insulating material, anti-reflective materials, or combinations thereof). In some embodiments, the plurality of isolation structures are shallow trench isolation structures. In the same or other embodiments, the plurality of isolation structures isolate a region of the image sensor, or more particularly a given pixel cell, for readout from the floating diffusion region as well as resetting the floating diffusion region.

It is appreciated that the plurality of transfer gates and similar components (e.g., the plurality of gate electrodes which may be included in the other components) may be formed using photolithography and convention deposition techniques to deposition the appropriate materials (e.g., polycrystalline silicon, metal such as Al, Cu, Au, Ag, Ti, Ta, or Nb), metal alloys such as TaN, $WN_x$, other metal nitrides, $RuO_x$, or other metal oxide gate electrode materials, or combinations thereof). As illustrated in embodiments of the disclosure, the plurality of transfer gates includes a first transfer gate, a second transfer gate, a third transfer gate, and/or a fourth transfer gate (e.g., any one of, or all of, the plurality of transfer gates 110), each disposed proximate to the first side of the semiconductor substrate and coupled to a respective one of the plurality of photodiodes. It is appreciated that in general the components of block 203 may be formed before implanting first and second dopants for foaming the floating diffusion region (i.e., before blocks 207-211).

Block 205 illustrates forming spacer regions (e.g., the plurality of spacer region 115) proximate to sidewalls of the plurality of transfer gates (e.g., the first transfer gate and the second transfer gate) such that the spacer regions are disposed between the first transfer gate and the second transfer gate. The spacers regions may be formed using conventional techniques (e.g., forming a layer of patterned photoresist with openings exposing sidewalls of the plurality of transfer gates and having a thickness similar to a target width of the spacer regions then depositing one or more constituent materials of the spacer regions). The spacer regions may include one or more materials (e.g., first material 117 and second material 119, which could include dielectric material such as silicon dioxide, silicon nitrides, an oxynitride, other insulating materials, or combinations thereof to provide additional isolation for leakage control). It is appreciated that the spacer regions are formed before the ion implantation process for forming the floating diffusion region (e.g., blocks 207-209). In other words, the spacer regions are formed before implanting the first dopants and the second dopants, which provides additional isolation control between the plurality of transfer gates and the plurality of photodiodes and the floating diffusion region.

Figure 3A:
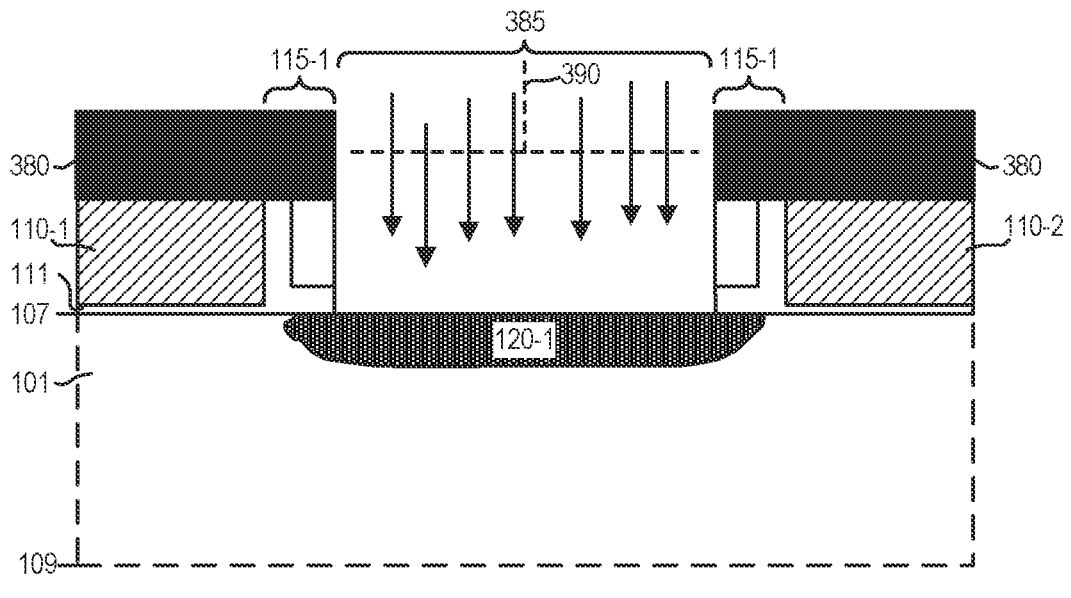
FIG. 3A illustrates an implantation step with ions directed at an angle normal to a surface of a semiconductor substrate for forming a central portion of a floating diffusion region with a shared mask, in accordance with embodiments of the present disclosure.
Figure 3B:
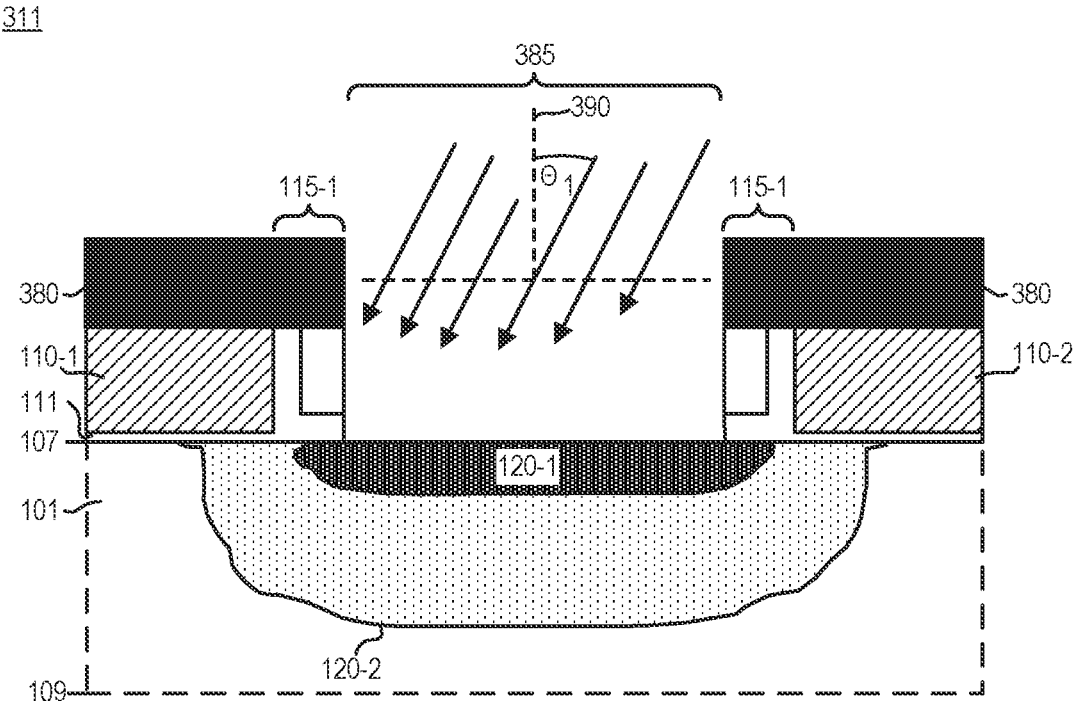
FIG. 3B illustrates an implantation step with ions directed at a non-normal angle with respect to a surface of the semiconductor substrate for forming a peripheral portion of a floating diffusion region with a shared mask, in accordance with embodiments of the present disclosure.

Block 207 illustrates forming a layer of patterned photoresist over the first side of the semiconductor substrate after forming the plurality of transfer gates and the plurality of photodiodes using an individual photomask (see, e.g., layer of patterned photoresist 380 illustrated in FIG. 3A and FIG. 3B). It is appreciated that, per pixel cell, the layer of patterned photoresist includes an opening (e.g., opening 385 illustrated in FIG. 3A and FIG. 3B) for forming a floating diffusion region of the pixel cell and may further include additional openings for forming other components (e.g., forming lightly doped drains or source/drain regions for the plurality of gate electrodes 140 illustrated in FIGS. 1A-1D). It is appreciated that form a top view of the semiconductor substrate the opening included in the layer of patterned photoresist may be shaped based on the arrangement of the plurality of transfer gates and/or spacer regions. For example, an opening of the layer of patterned photoresist formed with the common photomask is substantially equal to the opening formed by the rectangular arrangement formed by the proximal edges of the plurality of transfer gates 110 (e.g., the shape of the opening may substantially correspond to the shape of the central portion 120-1). However, it is appreciated that in other embodiments, the opening may also incorporate the thickness of the plurality of spacer regions, such that the opening does not expose the plurality of transfer gates or the plurality of spacer regions when conducting ion implantation operations for forming the floating diffusion region. In some embodiments, the opening included in the layer of patterned photoresist forms an irregular octagon to impart an octagonal or circular shape of the central portion of the floating diffusion region.

Block 209 shows implanting first dopants through the opening to form a central portion of the floating diffusion region (see, e.g., FIG. 3A). In some embodiments, the first dopants are implanted through the opening, which is aligned with edges or a perimeter of the spacer regions, at a normal angle with respect to the first side of the semiconductor substrate to form the central portion. However, it is appreciated that through diffusion and/or annealing, the dopants may extend under the opening such that the central portion extends a lateral distance (e.g., along the same direction that distance 124 illustrated in FIG. 1B extends) greater than a width of the opening. In some embodiments, the implant energy for forming the central portion is from 20-50 KeV. In the same or other embodiments, the implant dosage of the first dopants is in the range of $10^{14}$ to $10^{17}$ ions/cm$^2$ for a sufficient duration to achieve target doping concentration of the central portion.

Block 211 illustrates implanting second dopants through the opening at a non-normal angle with respect to the first side of the semiconductor substrate to form a peripheral portion of the floating diffusion region surrounding the central portion. In some embodiments, the non-normal angle of implanting the second dopants may result in dopants being implanted through corresponding spacer regions. It is appreciated that the two-step process for forming the floating diffusion region results in the floating diffusion region extending laterally within the semiconductor substrate a distance greater than the separation distance between the first transfer gate and the second transfer gate. In some embodiments, a first dopant concentration of the central portion (e.g., based, at least in part, on the implant dosage of the first dopants) from the first dopants is greater than a second dopant concentration of the peripheral portion from the second dopants (e.g., based, at least in part, on the implant dosage of the second dopants). In some embodiments, the first dopant concentration is at least two orders of magnitude greater than the second dopant concentration due, at least in part, to a difference between implant dosage when implanting the first dopants and the second dopants. In some embodiments, the implant energy is from 20-50 KeV for forming the peripheral portion. In the same or other embodiments, the non-normal angle with respect to the first side of the semiconductor substrate used when implanting the second dopants is from 20° to 60°. For example, the non-normal angle may correspond to approximately (e.g., within 10%) 20°, 25°, 30°, 35°, 40°, 45°, 50°, 55°, or 60° with respect to a normal of the surface. In the same or other embodiments, implant dosage is in the range of $10^{12}$ to $10^{15}$ ions/cm$^2$ for a sufficient duration to achieve target doping concentration of the peripheral portion. However, it is appreciated that other implant energy, non-normal angles, and implant dosage may be used in other embodiments of the disclosure. It is appreciated that in some embodiments, implanting the second dopants results is also used to form lightly doped drains and/or source region regions, which may result in the formation of a doped region disposed within the semiconductor substrate between the STI structure and the at least one of the first transfer gate or the second transfer gate. Accordingly, in some embodiments, a common dopant is included in both the peripheral portion of the floating diffusion region and the doping region proximate to the isolation structure. While it is shown that peripheral portion of the floating diffusion region is formed after the central portion (e.g., block 209 before block 211), in other embodiments the peripheral portion may be formed before the central portion (e.g., block 211 before block 209).

In some embodiments, the implantation steps of blocks 209 and 211 may include one or more thermal processes (e.g., annealing), which may facilitate lateral diffusion of the first and second dopants. It is appreciated that the thermal processes combined with the angled implantation may result in one or more extension tips being formed (e.g., the narrowing of the peripheral portion between the plurality of transfer gates and under individual ones of the plurality of transfer gates as illustrated in FIG. 1C). It is further notes that use a common photomask to form the central and peripheral portions of the floating diffusion region, in combination with appropriately selected implant energy (e.g., 20-50 KeV), implant dosage (e.g., $10^{13}$ to $10^{15}$ or other dosage), and implant angles (e.g., implant at 20°-60° with respect to a normal to the semiconductor substrate), can achieve targeted performance metrics (e.g., forming central and peripheral portions of the floating diffusion region at targeted depth in the semiconductor substrate with targeted doping concentrations and/or doping profiles) for blooming and leakage while simultaneously reducing manufacturing costs compared to conventional processes. Additionally, it is appreciated that process block 211 may include more than one angled implantation steps, which may be dependent on the number of transfer gates included in the plurality of transfer gates. For example, ions may be implanted towards each of the plurality of transfer gates at a specified angle (see, e.g., FIG. 3B).

In some embodiments, the method 200 may include additional steps that are not illustrated, including, but not limited to, removing photoresist, forming one or more of metal grids, color filters, microlenses, and other constituent components known by one of relevant skill in the art for forming an image sensor.

FIG. 3A illustrates an implantation step 309 with ions directed at an angle that corresponds to a normal 390 to a surface of the semiconductor substrate 101 for forming the central portion 120-1 of the floating diffusion region 120 with a layer of patterned photoresist 380 formed using a shared or common photomask, in accordance with embodiments of the present disclosure. It is appreciated that the implantation step 309 is one possible example of the process step demonstrated by block 209 illustrated in method 200 of FIG. 2. As illustrated, ions are implanted along the normal 390 to the first side 107 of the semiconductor substrate 101 (e.g., corresponding to a vertical implantation process) through opening 385 included in the layer of patterned photoresist 380 to form the central portion 120-1 of the floating diffusion region. It is further appreciated that implantation step 309 may correspond to an intermediary step for forming the pixel cell 100 illustrated in FIGS. 1A-1D and thus may include the same or similar components (e.g., the gate dielectric 111, the plurality of transfer gates 110, the plurality of spacer regions 115, and other unlabeled elements). In some embodiments, the central portion 120-1 may extend, at least in part, under the plurality of spacer regions 115 (e.g., the first spacer region 115-1 and/or the second spacer region 115-2).

FIG. 3B illustrates implantation step 311 with ions directed at a non-normal angle, $\theta_1$, with respect to a surface of the semiconductor substrate 101 (e.g., the first side 107 and/or the second side 109) for forming a peripheral portion 120-2 of a floating diffusion region 120 with a layer of patterned photoresist 380 formed using a shared or common photomask, in accordance with embodiments of the present disclosure. It is appreciated that the implantation step 311 is one possible example of the process step demonstrated by block 211 illustrated in method 200 of FIG. 2. As illustrated, $\theta_1$ demonstrates, at least in part, the directionality for forming the peripheral portion 120-2 at a non-normal angle with respect to the normal 390 to direct second dopants under at least the first transfer gate 110-1 to form the floating diffusion region 120 with a targeted junction depth. It is appreciated that in some embodiments, there may be multiple ion implantation steps for forming the peripheral portion 120-2, which may be respectively angles towards different transfer gates included in the pixel cell. For example, in some embodiments, ion implantation of the second dopants may occur at $-\theta_1$ to direct second dopants under the second transfer gate 110-2. Similarly changes in $\theta_1$ may occur to direct ions towards other transfer gates included in the plurality of transfer gates 110 such that the floating diffusion region 120 is sufficiently formed to couple with each of the plurality of transfer gates 110. In doing so, the peripheral portion 120-2 of the floating diffusion region 120 extends into the semiconductor substrate 101 under the plurality of spacer regions 115 (e.g., the first spacer region 115-1 and the second spacer region 115-2) and the plurality of transfer gates (e.g., the first transfer gate 110-1 and the second transfer gate 110-2). Additionally, and as illustrated, the first side 107 of the semiconductor substrate 101 is disposed between the first transfer gate 110-1 and the peripheral portion 120-2 of the floating diffusion region 120. The first side 107 of the semiconductor substrate 101 is also disposed between the second transfer gate 110-2 and the peripheral portion 120-2 of the floating diffusion region 120.

Figure 4A:
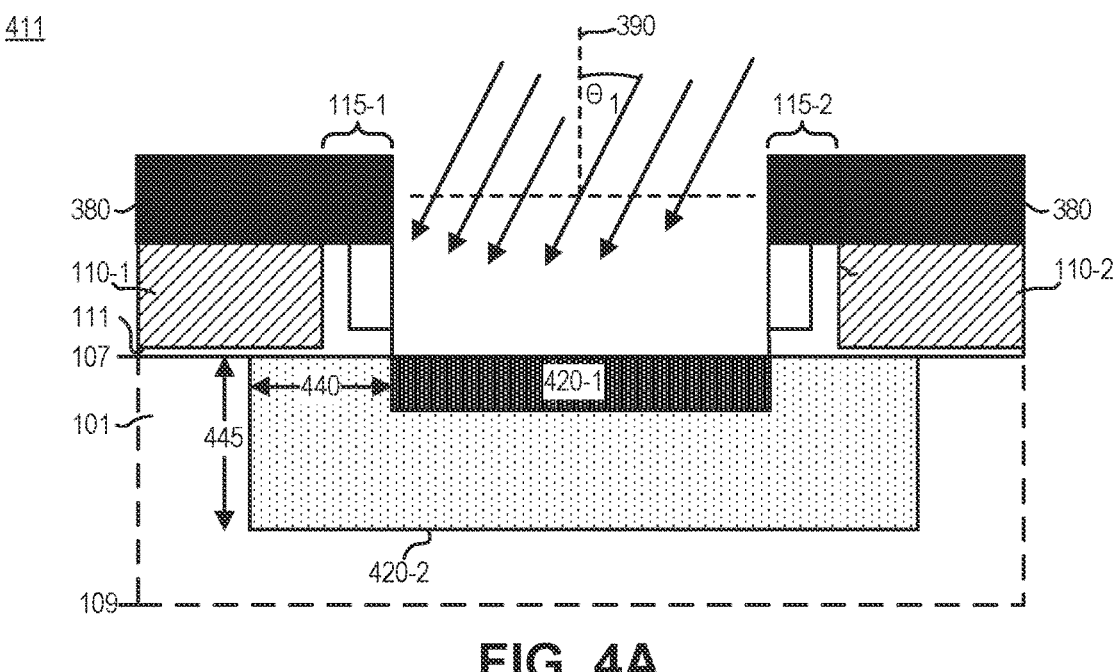
FIG. 4A shows a schematic detailing how angle of ion implantation may be used to control lateral spread and depth of the peripheral portion of the floating diffusion region, in accordance with embodiments of the present disclosure.

FIG. 4A shows a schematic 411 detailing how the angle $\theta_1$ of ion implantation may be used to control lateral spread 440 and depth 445 of the peripheral portion 420-2 of the floating diffusion region 420, in accordance with embodiments of the present disclosure. It is appreciated that schematic 411 is similar in many regards to schematic 311 illustrated in FIG. 3B and thus may include the same or similar elements. One difference is the illustration of the floating diffusion region 420, which may be representative of the floating diffusion region 120 illustrated in FIGS. 1A-3B, has been simplified to show the lateral spread 440 and depth 445 of the floating diffusion region 420 more clearly. It is appreciated that the lateral spread 440 and the depth 445 may be optimized by selecting the appropriate implant energy and tilt angle (i.e., 01) to achieve targeted performance metrics for blooming and leakage while simultaneously reducing manufacturing costs compared to conventional processes.

Figure 4B:
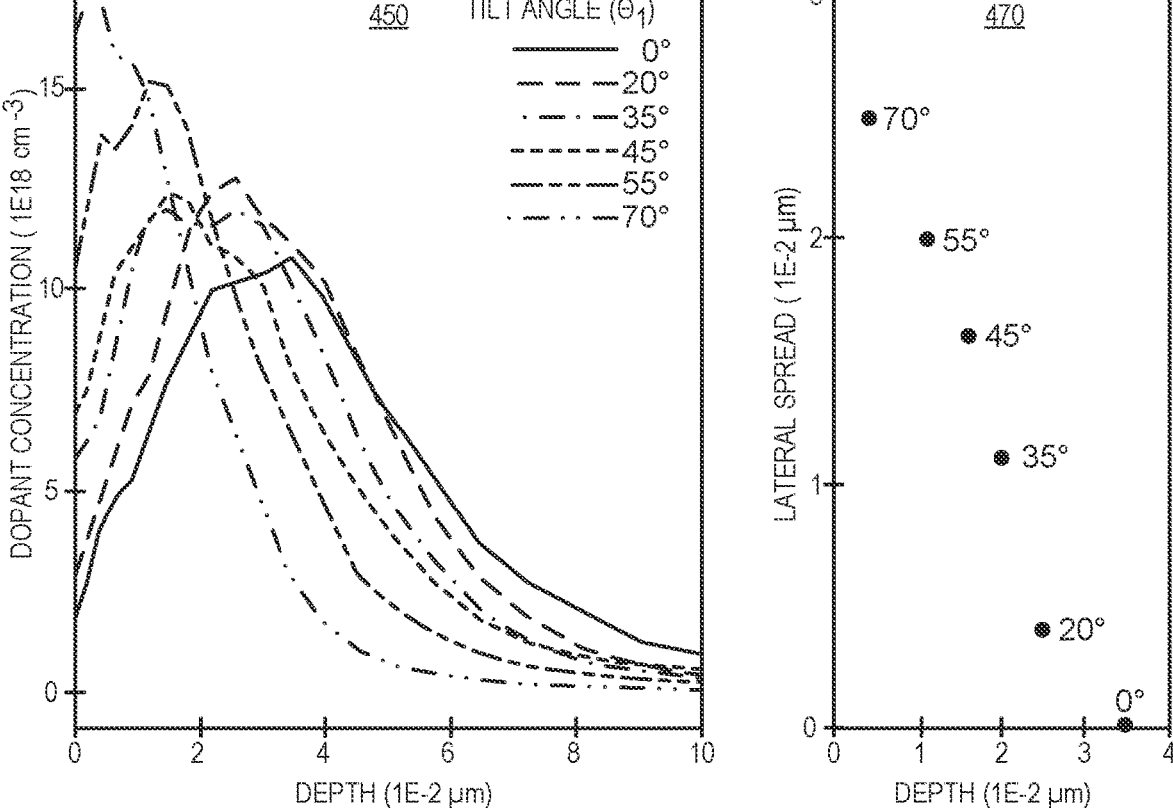
FIG. 4B show example charts illustrating dopant concentration with respect to depth and lateral spread with respect to depth at various ion implantation angles when forming the floating diffusion region, in accordance with embodiments of the present disclosure.

FIG. 4B show example charts 450 and 470 illustrating dopant concentration (e.g., of the second dopant when forming the peripheral portion 420-2 illustrated in FIG. 4A) with respect to depth and lateral spread with respect to depth at various ion implantation angles when forming the floating diffusion region, in accordance with embodiments of the present disclosure. Specifically, it was found that at a fixed implant angle (i.e., $\theta_1$ of FIG. 4A), increasing implant energy results in increased lateral spread (i.e., 440 of FIG. 4A) and depth (i.e., 445 of FIG. 4A), which may be utilized to improve blooming and low light image lag performance, but it is appreciated that increasing implant energy also has the risk for increasing bright light image lag and leakage current. However, at fixed implant energy, it was found that increasing implant angle (i.e., $\theta_1$ of FIG. 4A) results in increased lateral spread (i.e., 440 of FIG. 4A) but reduced depth (i.e., 445 of FIG. 4A) as shown in charts 450 and 470. Thus, implant energy and implant angle may be tuned based on the semiconductor substrate material, pixel size, transistor gate size (e.g., size of the plurality of transfer gates 110), and desired implant concentration of the peripheral portion (e.g., peripheral portion 420-2 illustrated in FIG. 4A), to achieve targeted performance metrics for blooming and leakage while simultaneously reducing manufacturing costs compared to conventional processes. In some embodiments, it was found that an implant angle in the range of 20°-60° provided targeted performance metrics.

Figure 5:
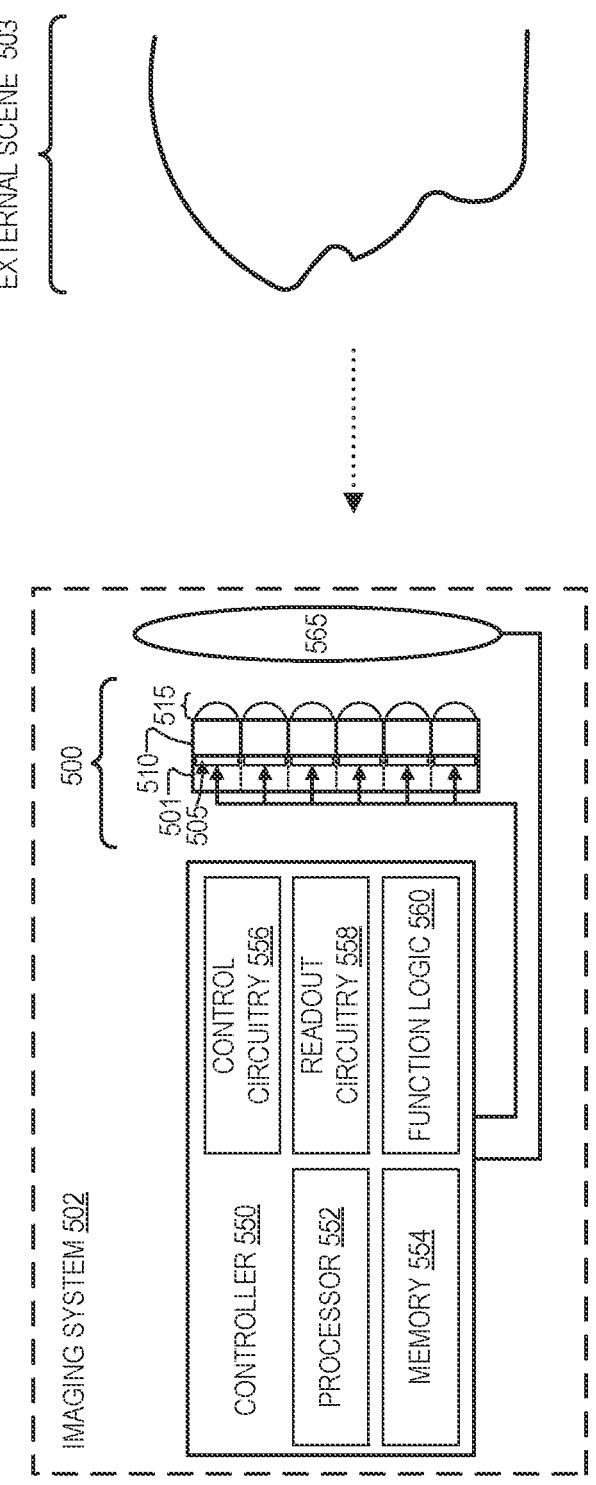
FIG. 5 illustrates an example imaging system including an image sensor with a plurality of pixel cells, each having a floating diffusion region formed via a shared photomask, in accordance with embodiments of the present disclosure.

FIG. 5 illustrates an example imaging system 502 including an image sensor 500 with a floating diffusion region formed via shared photomask, in accordance with embodiments of the present disclosure. The image sensor 500 may include a plurality of pixel cells, each corresponding to instances of the pixel cell 100 illustrated in FIG. 1A-1D, which are further described in FIG. 3A-4B, in accordance with embodiments of the present disclosure. The imaging system 502 includes image sensor 500 to generate electrical or image signals in response to incident radiation 570, objective lens(es) 565 with adjustable optical power to focus on one or more points of interest within the external scene 503, and controller 550 to control, inter alia, operation of image sensor 500 and objective lens(es) 565. Image sensor 500 is a simplified schematic showing a semiconductor material 501 with a plurality of pixel cells, each including at least one of the photodiodes 505 disposed within respective portions of the semiconductor material 501, a plurality of color filters 510, and a plurality of microlenses 515. The controller 550 includes one or more processors 552, memory 554, control circuitry 556, readout circuitry 558, and function logic 560.

The controller 550 includes logic and/or circuitry to control the operation (e.g., during pre-, post-, and in situ phases of image and/or video acquisition) of the various components of imaging system 502. The controller 550 can be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic. In one embodiment, the controller 550 includes the processor 552 coupled to memory 554 that stores instructions for execution by the controller 550 and/or one or more other components of the imaging system 502. The instructions, when executed, can cause the imaging system 502 to perform operations associated with the various functional modules, logic blocks, or circuitry of the imaging system 502 including any one of, or a combination of, the control circuitry 556, the readout circuitry 558, the function logic 560, image sensor 500, objective lens 565, and any other element of imaging system 502 (illustrated or otherwise). The memory is a non-transitory computer-readable medium that can include, without limitation, a volatile (e.g., RAM) or non-volatile (e.g., ROM) storage system readable by controller 550. It is further appreciated that the controller 550 can be a monolithic integrated circuit, one or more discrete interconnected electrical components, or a combination thereof. Additionally, in some embodiments one or more electrical components can be coupled together to collectively function as controller 550 for orchestrating operation of the imaging system 502.

Control circuitry 556 can control operational characteristics of the photodiode array 505 (e.g., exposure duration, when to capture digital images or videos, and the like). Readout circuitry 558 reads or otherwise samples the analog signal from the individual photodiodes (e.g., read out electrical signals generated by each of the plurality of photodiodes 505 in response to incident light to generate image signals for capturing an image frame, and the like) and can include amplification circuitry, analog-to-digital (ADC) circuitry, image buffers, or otherwise. In the illustrated embodiment, readout circuitry 558 is included in controller 550, but in other embodiments readout circuitry 558 can be separate from the controller 550. Function logic 560 is coupled to the readout circuitry 558 to receive image data to de-mosaic the image data and generate one or more image frames. In some embodiments, the electrical signals and/or image data can be manipulated or otherwise processed by the function logic 560 (e.g., apply post image effects such as crop, rotate, remove red eye, adjust brightness, adjust contrast, or otherwise).

Spatially relative terms, such as "beneath," "below," "over," "under," "above," "upper," "top," "bottom," "left," "right," "center," "middle," and the like, can be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device can be otherwise oriented (rotated ninety degrees or at other orientations) and the spatially relative descriptors used herein are interpreted accordingly. In addition, it will also be understood when an element is referred to as being "between" two other elements, it can be the only element between the two other elements, or one or more intervening elements can also be present.

The processes explained above can be implemented using software and/or hardware. The techniques described can constitute machine-executable instructions embodied within a tangible or non-transitory machine (e.g., computer) readable storage medium, when executed by a machine (e.g., controller 550 of FIG. 5) will cause the machine to perform the operations described. Additionally, the processes can be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes disposed within a semiconductor substrate proximate to a first side of the semiconductor substrate;
   a first transfer gate and a second transfer gate, each disposed proximate to the first side of the semiconductor substrate, wherein the first transfer gate is laterally separated from the second transfer gate by a separation distance;
   a floating diffusion region coupled to a first photodiode and a second photodiode included in the plurality of photodiodes respectively by the first transfer gate and the second transfer gate, wherein the floating diffusion region extends laterally within the semiconductor substrate a distance greater than the separation distance between the first transfer gate and the second transfer gate, wherein the floating diffusion region includes a central portion surrounded by a peripheral portion, and wherein a first dopant concentration of the central portion is greater than a second dopant concentration of the peripheral portion; and
   a spacer region formed proximate to a sidewall of the first transfer gate such that the spacer region is disposed between the first transfer gate and the second transfer gate, and wherein at least a part of the central portion of the floating diffusion region is disposed between the spacer region and the semiconductor substrate.

2. The image sensor of claim 1, further comprising a third transfer gate to couple a third photodiode included in the plurality of photodiodes to the floating diffusion region, wherein the third transfer gate is disposed adjacent to the first transfer gate and the second transfer gate, wherein the separation distance between the first transfer gate and the second transfer gate is greater than a second separation distance between the first transfer gate and the third transfer gate.

3. The image sensor of claim 2, wherein a first edge and a second edge of the peripheral portion converge between the first transfer gate and the third transfer gate.

4. The image sensor of claim 2, wherein the peripheral portion narrows between the first transfer gate and the third transfer gate, and wherein the peripheral portion narrows between the second transfer gate and the third transfer gate.

5. The image sensor of claim 2, further comprising a fourth transfer gate to couple a fourth photodiode included in the plurality of photodiodes to the floating diffusion region, wherein the fourth transfer gate is disposed adjacent to the first transfer gate and the second transfer gate, wherein proximal edges of the first, second, third, and fourth transfer gates surround the central portion of the floating diffusion region, and wherein the peripheral portion extends laterally such that at least part of the peripheral portion is disposed underneath each of the first transfer gate, the second transfer gate, the third transfer gate, and the fourth transfer gate.

6. The image sensor of claim 1, wherein the central portion and the peripheral portion of the floating diffusion region are formed with different ion implantation operations using a common photomask.

7. The image sensor of claim 6, wherein the different ion implantation operations using the common photomask include a vertical implantation process and an angled ion implantation process for forming the peripheral portion by implanting dopants at a non-normal angle with respect to the first side of the semiconductor substrate.

8. The image sensor of claim 1, further comprising:
   a shallow trench isolation (STI) structure formed within the semiconductor substrate and disposed proximate to at least one of the first transfer gate or the second transfer gate, wherein the STI structure defines a device region of the image sensor for readout from the floating diffusion region, the device region including at least one of a reset gate, a source-follower gate, or a row-select gate; and a doped region disposed outside of the device region and within the semiconductor substrate between the STI structure and the at least one of the first transfer gate or the second transfer gate, wherein a common dopant type is included in both the peripheral portion of the floating diffusion region and the doped region proximate to the STI structure.

9. The image sensor of claim 8, wherein the doped region is disposed in a well and further disposed between the STI structure and one of the plurality of photodiodes, and wherein a dopant concentration of the doped region is at least one order of magnitude less than a dopant concentration of the well.

10. The image sensor of claim 1, wherein the peripheral portion of the floating diffusion region has a nonuniform dopant concentration including the second dopant concentration disposed proximate to the first transfer gate and the second transfer gate and a third dopant concentration disposed proximate to the spacer regions, wherein the third dopant concentration is greater than the second dopant concentration but less than the first dopant concentration, and wherein the first dopant concentration is at least two orders of magnitude greater than the second dopant concentration.

11. The image sensor of claim 1, the spacer region being a first spacer region, the image sensor further comprising a second spacer region formed proximate to a sidewall of the second transfer gate such that the second spacer region faces the first spacer region, and wherein at least a part of the central portion is further extended to be between the second spacer region and the semiconductor substrate.

12. The image sensor of claim 11, wherein the first spacer region is physically separated from the second spacer region.

13. The image sensor of claim 1, further comprising:

an isolation structure formed within the semiconductor substrate; and a doped region disposed between the isolation structure and the first transfer gate, wherein a same dopant type is included in both the floating diffusion region and the doped region.

14. The image sensor of claim 13, wherein the doped region is disposed between the isolation structure and the first photodiode.

15. The image sensor of claim 1, wherein the first dopant concentration is at least two orders of magnitude greater than the second dopant concentration.

16. An image sensor, comprising:

a plurality of photodiodes disposed within a semiconductor substrate proximate to a first side of the semiconductor substrate;

a first transfer gate and a second transfer gate, each disposed proximate to the first side of the semiconductor substrate, wherein the first transfer gate is laterally separated from the second transfer gate by a separation distance;

a floating diffusion region coupled to a first photodiode and a second photodiode included in the plurality of photodiodes respectively by the first transfer gate and the second transfer gate, wherein the floating diffusion region extends laterally within the semiconductor substrate a distance greater than the separation distance between the first transfer gate and the second transfer gate, wherein the floating diffusion region includes a central portion surrounded by a peripheral portion, and wherein a first dopant concentration of the central portion is greater than a second dopant concentration of the peripheral portion;

a shallow trench isolation (STI) structure formed within the semiconductor substrate and disposed proximate to at least one of the first transfer gate or the second transfer gate, wherein the STI structure defines a device region of the image sensor for readout from the floating diffusion region, the device region including at least one of a reset gate, a source-follower gate, or a row-select gate; and a doped region disposed outside of the device region and within the semiconductor substrate between the STI structure and the at least one of the first transfer gate or the second transfer gate, wherein a common dopant type is included in both the peripheral portion of the floating diffusion region and the doped region proximate to the STI structure.

17. The image sensor of claim 16, wherein the doped region is disposed in a well and further disposed between the STI structure and one of the plurality of photodiodes, and wherein a dopant concentration of the doped region is at least one order of magnitude less than a dopant concentration of the well.

18. An image sensor, comprising:

a plurality of photodiodes disposed within a semiconductor substrate proximate to a first side of the semiconductor substrate;

a first transfer gate and a second transfer gate, each disposed proximate to the first side of the semiconductor substrate, wherein the first transfer gate is laterally separated from the second transfer gate by a separation distance;

a floating diffusion region coupled to a first photodiode and a second photodiode included in the plurality of photodiodes by the first transfer gate and the second transfer gate, wherein the floating diffusion region extends laterally within the semiconductor substrate a distance greater than the separation distance between the first transfer gate and the second transfer gate, wherein the floating diffusion region includes a central portion surrounded by a peripheral portion, and wherein a first dopant concentration of the central portion is greater than a second dopant concentration of the peripheral portion; and a spacer region formed proximate to a sidewall of at least the first transfer gate or the second transfer gate such that the spacer region is disposed between the first transfer gate and the second transfer gate, wherein the peripheral portion of the floating diffusion region has a nonuniform dopant concentration including the second dopant concentration disposed proximate to the first transfer gate and the second transfer gate, and a third dopant concentration disposed proximate to the spacer region, wherein the third dopant concentration is greater than the second dopant concentration but less than the first dopant concentration, and wherein the first dopant concentration is at least two orders of magnitude greater than the second dopant concentration.

19. The image sensor of claim 18, further comprising:

a shallow trench isolation (STI) structure formed within the semiconductor substrate and disposed proximate to at least one of the first transfer gate or the second transfer gate, wherein the STI structure defines a device region of the image sensor for readout from the floating diffusion region, the device region including at least one of a reset gate, a source-follower gate, or a row-select gate; and a doped region disposed outside of the device region and within the semiconductor substrate between the STI structure and the at least one of the plurality of photo-diode, the doped region having a conductivity type being the same as that of the floating diffusion region.

20. The image sensor of claim 19, wherein a common dopant type is included in both the peripheral portion of the floating diffusion region and the doped region is proximate to the STI structure.

* * * * *